US009700963B2

(12) United States Patent
Ohnishi et al.

(10) Patent No.: US 9,700,963 B2
(45) Date of Patent: Jul. 11, 2017

(54) LEAD-FREE SOLDER BALL

(71) Applicant: Senju Metal Industry Co., Ltd., Tokyo (JP)

(72) Inventors: Tsukasa Ohnishi, Tokyo (JP); Yoshie Yamanaka, Tokyo (JP); Ken Tachibana, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/196,227

(22) Filed: Jun. 29, 2016

(65) Prior Publication Data

US 2016/0339543 A1 Nov. 24, 2016

Related U.S. Application Data

(62) Division of application No. 14/005,948, filed as application No. PCT/JP2012/058271 on Mar. 28, 2012.

(30) Foreign Application Priority Data

Mar. 28, 2011 (WO) ............... PCT/JP2011/057532

(51) Int. Cl.
*B23K 35/00* (2006.01)
*B23K 35/22* (2006.01)
(Continued)

(52) U.S. Cl.
CPC ........ *B23K 35/0244* (2013.01); *B23K 1/0016* (2013.01); *B23K 35/025* (2013.01); *B23K 35/0222* (2013.01); *B23K 35/26* (2013.01); *B23K 35/262* (2013.01); *B32B 15/018* (2013.01); *C22C 13/00* (2013.01); *H01L 24/11* (2013.01); *H01L 24/13* (2013.01); *H01L 24/81* (2013.01); *H05K 3/3463* (2013.01); *H01L 23/3114* (2013.01); *H01L 24/05* (2013.01); *H01L 2224/0401* (2013.01); *H01L 2224/05644* (2013.01); *H01L 2224/05647* (2013.01);
(Continued)

(58) Field of Classification Search
CPC .. B23K 35/262; B23K 2201/36; B23K 35/26; B23K 1/00
USPC .................................... 228/101, 180.2, 56.3
See application file for complete search history.

(56) References Cited

U.S. PATENT DOCUMENTS 5,783,870 A * 7/1998 Mostafazadeh ....... H01L 25/105
257/686
6,702,176 B2 3/2004 Ito et al.
(Continued)

FOREIGN PATENT DOCUMENTS

CN 101120109 A 2/2008
CN 101374630 A 2/2009
(Continued)

*Primary Examiner* — Erin Saad
(74) *Attorney, Agent, or Firm* — The Webb Law Firm

(57) ABSTRACT

Provided is a process for mounting a BGA (Ball Grid Array) or CSP (Chip Size Package) on a printed circuit board. The process includes melting and fusing together solder paste and a solder ball. The solder ball has a solder composition that includes 0.5-1.1 mass % of Ag, 0.7-0.8 mass % of Cu, 0.05-0.08 mass % of Ni, and a remainder of Sn. In the process, the solder ball is placed on an electrode of the BGA or CSP substrate and the solder paste is applied onto an opposing electrode of the printed circuit board.

14 Claims, 4 Drawing Sheets

(51) Int. Cl.
  *B23K 35/02* (2006.01)
  *B23K 35/26* (2006.01)
  *C22C 13/00* (2006.01)
  *B32B 15/01* (2006.01)
  *H05K 3/34* (2006.01)
  *B23K 1/00* (2006.01)
  *H01L 23/00* (2006.01)
  *H01L 23/31* (2006.01)

(52) U.S. Cl.
  CPC ............ *H01L 2224/1134* (2013.01); *H01L 2224/13005* (2013.01); *H01L 2224/1312* (2013.01); *H01L 2224/13014* (2013.01); *H01L 2224/1316* (2013.01); *H01L 2224/13016* (2013.01); *H01L 2224/13105* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *H01L 2224/13155* (2013.01); *H01L 2224/13157* (2013.01); *H01L 2224/13169* (2013.01); *H01L 2224/16225* (2013.01); *H01L 2224/81815* (2013.01); *H01L 2924/014* (2013.01); *H01L 2924/01015* (2013.01); *H01L 2924/01322* (2013.01); *H01L 2924/15311* (2013.01); *H01L 2924/2076* (2013.01); *H05K 2201/10734* (2013.01)

(56) References Cited

U.S. PATENT DOCUMENTS

| | | |
|---|---|---|
| 7,108,830 B2 | 9/2006 | Carden |
| 7,186,288 B2 | 3/2007 | Carden |
| 7,338,567 B2 | 3/2008 | Munekata et al. |
| 7,682,468 B2 | 3/2010 | Munekata et al. |
| 8,302,838 B2 | 11/2012 | Mukai et al. |
| 2002/0051728 A1* | 5/2002 | Sato .............. B22F 1/0048 420/562 |
| 2002/0190378 A1* | 12/2002 | Hsu ............... H01L 21/4846 257/745 |
| 2003/0003011 A1 | 1/2003 | Kato et al. |
| 2009/0196789 A1 | 8/2009 | Kobayashi et al. |
| 2009/0304545 A1 | 12/2009 | Tanaka et al. |
| 2012/0175020 A1* | 7/2012 | Imamura .......... B23K 35/025 148/24 |

FOREIGN PATENT DOCUMENTS

| | | |
|---|---|---|
| JP | 1177366 A | 3/1999 |
| JP | 11277290 A | 10/1999 |
| JP | 200196394 A | 4/2001 |
| JP | 2002239780 A | 8/2002 |
| JP | 2002246742 A | 8/2002 |
| JP | 2002307187 A | 10/2002 |
| JP | 200394195 A | 4/2003 |
| JP | 2003230980 A | 8/2003 |
| JP | 2004141910 A | 5/2004 |
| JP | 2005153007 A | 6/2005 |
| JP | 2005246480 A | 9/2005 |
| JP | 2007237249 A | 9/2007 |
| TW | 201209944 A1 | 3/2012 |
| WO | 2006129713 A1 | 12/2006 |
| WO | 2006134891 A1 | 12/2006 |
| WO | 2007081006 A1 | 7/2007 |
| WO | 2007102588 A1 | 9/2007 |

* cited by examiner

LEAD-FREE SOLDER BALL

CROSS-REFERENCE TO RELATED APPLICATIONS

This application is a divisional of U.S. patent application Ser. No. 14/005,948, filed Sep. 18, 2013, issued as U.S. Pat. No. 9,527,167, which is the United States national phase of International Application No. PCT/JP2012/058271 filed Mar. 28, 2012, which claims priority to International Application No. PCT/JP2011/057532 filed Mar. 28, 2011, the disclosures of each of which is hereby incorporated in their entirety by reference.

BACKGROUND OF THE INVENTION

Field of the Invention

This invention relates to a lead-free solder ball for use on electrodes of electronic parts such as semiconductors. In particular, it relates to a lead-free solder ball which can be used for both of an Ni electrode such as one plated with Au and a Cu electrode made of Cu coated with a water-soluble preflux and which produces a low rate of failure when an electronic part having such electrodes is dropped.

Description of Related Art

In recent years, as electronic equipment becomes smaller and electric signals become faster, electronic parts used in electronic equipment are becoming smaller and multifunctional. Some examples of these small, multifunctional electronic parts are BGAs (Ball Grid Arrays), CSPs (Chip Size Packages), and MCMs (Multichip Modules), which are collectively BGAs. A BGA comprises a BGA substrate having s a large number of electrodes provided in a grid-like pattern on the rear surface thereof. When a BGA is mounted on a printed circuit board, the electrodes of the BGA substrate are bonded to the lands of the printed circuit board using solder. When mounting a BGA on a printed circuit board, if soldering is performed by individually supplying solder to each electrode, not only is a great deal of effort required, but it is not possible to supply solder from the exterior to electrodes located in a center portion of the BGA. Therefore, when mounting a BGA on a printed circuit board, a method is employed in which a mound of solder is previously placed on each electrode of the BGA. This process is referred to as solder bump formation.

Solder bumps are formed on a BGA using solder balls, solder paste, or the like. When solder bumps are formed using solder balls, a sticky flux is applied to the BGA electrodes, and then solder balls are placed on the flux-coated electrodes. The BGA substrate is then heated in a heating apparatus such as a reflow furnace to melt the solder balls and thereby form solder bumps on the electrodes. Semiconductor substrates such as BGA substrates and CSP substrates are collectively called module substrates. When solder bumps are formed on the lands of a wafer using a solder paste, a metal mask having punched holes of roughly the same size as the lands of the wafer in positions matching the lands is placed on the wafer, and a solder paste is spread and wiped with a squeegee from atop the metal mask to print the solder paste on the lands of the wafer. The wafer is then heated in a reflow furnace to melt the solder paste and thereby form solder bumps.

In the case of conventional BGAs, solder balls made of an Sn—Pb alloy were used to form solder bumps. Solder balls made of an Sn—Pb solder alloy are not only superior with respect to solderability to BGA electrodes, but particularly an Sn—Pb alloy having a eutectic composition has a melting point that has no thermal effects on BGA elements, substrates, or the like at the time of soldering. In addition, since the solder balls contain Pb, which is soft, the resulting solder bumps can absorb impacts when an electronic part or electronic equipment in which these solder balls are used is dropped, and this ability greatly contributes to increasing the lifespan of electronic parts, electronic equipment, and the like. However, the use of Pb is now being increasingly regulated on a global scale, so naturally an Sn—Pb eutectic composition which has conventionally been used for soldering is also being regulated.

Conventionally, Sn—Ag—Cu based solder alloys such as Sn-3.0Ag-0.5Cu and Sn-4.0Ag-0.5Cu have been used as compositions for lead-free solder balls for BGAs. These lead-free solder alloys have excellent heat cycle properties. However, when portable electronic equipment in which solder balls having these solder alloy compositions are used is dropped, interface peeling easily takes place at the solder ball bonding interface, and for this reason, these alloys have been thought to have poor resistance to drop impacts (resistance to impacts due to dropping).

The following solder alloy compositions for lead-free solder balls are proposed to prevent impacts due to dropping of portable electronic equipment: a lead-free solder alloy comprising, in mass %, (1) Ag: 0.8-2.0%, (2) Cu: 0.05-0.3%, and (3) one or more elements selected from In: at least 0.01% and less than 0.1%, Ni: 0.01-0.04%, Co: 0.01-0.05%, and Pt: 0.01-0.1%, and a remainder of Sn (WO 2006/129713 A, Patent Document 1); a lead-free solder alloy which is characterized by comprising Ag: 1.0-2.0 mass %, Cu: 0.3-1.5 mass %, and a remainder of Sn and unavoidable impurities, and which may further contain one or more of Sb: 0.005-1.5 mass %, Zn: 0.05-1.5 mass %, Ni: 0.05-1.5 mass %, and Fe: 0.005-0.5 mass % with the total content of Sb, Zn, Ni, and Fe being at most 1.5 mass % (JP 2002-239780 A, Patent Document 2); a lead-free solder alloy comprising, in mass %, 0.1-1.5% of Ag, 0.5-0.75% of Cu, Ni in an amount satisfying the relationship 12.5≤Cu/Ni≤100, and a remainder of Sn and unavoidable impurities (WO 2007/081006 A, Patent Document 3); and a lead-free solder alloy comprising 1.0-2.0 mass % of Ag, 0.3-1.0 mass % of Cu, 0.005-0.10 mass % of Ni, and a remainder of Sn and unavoidable impurities (WO 2007/102588 A, Patent Document 4). In addition, a method of applying a flux to the electrodes of a module substrate is disclosed as a method of solving the problem of fusion defects which develop at the time of bonding a module such as a BGA substrate to a printed circuit board (WO 2006-134891 A, Patent Document 5).

PRIOR ART DOCUMENTS

Patent Documents

Patent Document 1: WO 2006/129713 A
Patent Document 2: JP 2002-239780 A
Patent Document 3: WO 2007/081006 A
Patent Document 4: WO 2007/102588 A
Patent Document 5: WO 2006/134891 A

SUMMARY OF THE INVENTION

Problem which the Invention is to Solve

In order to improve resistance to drop impacts of Sn—Ag—Cu based solder balls, Patent Documents 1 through 4 disclose decreasing the Ag content to reduce the hardness of the resulting solder and increase the amount of impact energy which is absorbed, decreasing the Cu content to reduce the thickness of a layer of intermetallic compounds such as $Cu_6Sn_5$ which are formed in the bonding surface between a land and solder so that peeling in the bonding interface is prevented, and compensating for a decrease in the strength of the solder itself due to a decrease in the Cu and Ag content by adding at least one iron group element such as Ni, Fe, or Co.

However, even when solder balls which employ a measure for improving resistance to drop impacts as disclosed in Patent Documents 1 through 4 are used, the problem occurs that malfunctions due to dropping of electronic equipment do not decrease. Upon analyzing this problem, it was found that malfunctions due to dropping of electronic equipment, which are increased compared to conventional Sn—Pb solder, do not occur only at bonding interfaces between circuit boards and solder balls like those disclosed in Patent Documents 1-5. Namely, as the shift from use of Sn—Pb solder towards use of lead-free solder progresses, new defects referred to as fusion defects occur when module substrates such as BGA substrates are bonded to printed circuit boards. In fusion defects, the solder components of solder balls used on electrodes of BGAs and the solder components of solder paste used for soldering of printed circuit boards do not mix with each other (see FIG. 1).

It was also found that there has been much occurrence of fusion defects accompanying the shift from solder balls having an Sn-3.0Ag-0.5Cu composition to solder balls having an Sn—Ag—Cu—Ni composition, which were developed as a countermeasure to provide resistance to drop impacts. The cause of fusion defects is thought to be that Ni, which is added to improve resistance of solder balls to impacts due to dropping, forms intermetallic compounds with Sn which precipitate on the surface of solder balls and interfere with mixing of the solder components of solder balls and the solder components of solder paste.

The following is also conceivable as a cause of fusion defects. When a printed circuit board undergoes a large amount of warping due to heating, solder balls and solder paste separate from the each other. If heating is carried out while solder balls and solder paste are separated from each other in this manner, the surfaces of the solder balls are oxidized by high temperatures. Flux which bleeds from the solder paste covers the surfaces of the solder balls, and when the flux loses its activating power, upon the warping disappearing during cooling, even if the solder paste and the solder balls contact each other, it is not possible to remove the oxide film from the surfaces of the solder balls, and fusion defects occur. The method disclosed in Patent Document 5 is effective at solving this problem.

It was found from examples that depending on the composition of solder balls, fusion defects are caused by the compound $Cu_6Sn_5$ or $(Cu,Ni)_6Sn_5$ which is formed inside solder balls. When electronic parts to which solder balls are bonded are mounted on a mounting substrate, mounting is carried out with electrodes to which the solder balls are bonded facing downwards with respect to the mounting substrate on which a solder paste has been printed. Heating is then carried out, and the solder balls and the solder paste are melted and fused together. However, when a large amount of the compound $Cu_6Sn_5$ or $(Cu,Ni)_6Sn_5$ is formed inside the solder balls, the phenomenon occurs that the compound sediments inside the solder balls at the time of melting of the solder balls and precipitates in the vicinity in the outermost surface of the resulting bumps. It has been confirmed that this phenomenon becomes a factor which interferes with fusion with solder paste and causes fusion defects (see FIGS. 2 and 3).

Solder balls used in BGAs and CSPs need to have resistance to drop impacts. One effective measure for providing resistance to drop impacts is to modify interface compounds, and as disclosed in Patent Documents 1-4, the addition of Ni is one measure to achieve this modification. However, because Ni is an element which forms compounds, from the standpoint of fusion defects, the amount of Ni which can be added is limited. If the addition of Cu or Ni is suppressed out of consideration of fusion defects, resistance to drop impacts is lost, and the solder alloy ends up being inappropriate for solder balls for BGAs, CSPs, or the like which are much mounted in portable equipment.

The problem to be solved by the present invention is to develop a solder alloy for a solder ball which does not develop fusion defects even with a solder ball having an Sn—Ag—Cu—Ni composition which increases solder strength such as resistance to drop impacts, and to obtain a solder ball for BGAs or CSPs which has a low rate of failure when electronic parts are dropped and which is effective even when a printed circuit board to which bonding is to take place has Cu electrodes or electroplated Ni/Au electrodes or electroless Ni/Pd/Au electrodes formed by lower Ni plating followed by surface treatment in the form of Au plating or Au/Pd plating by suppressing interface peeling in bonding interfaces of solder balls and suppressing fusion defects which develop between solder balls and solder paste.

Means for Solving the Problem

The present inventors found that a solder alloy for a solder ball which has resistance to drop impacts and a low rate of occurrence of fusion defects produces few failures due to dropping of portable electronic equipment, that the rate of occurrence of fusion defects increases and a large number of failures due to dropping of portable electronic equipment develop if an iron group metal such as Ni, which is contained in a solder alloy having resistance to drop impacts, precipitates on the surfaces of solder balls, and that by prescribing the amount of Ni which is added to a solder alloy, fusion defects and therefore problems due to dropping of portable electronic equipment decrease, and they completed the present invention.

In the present invention, an Sn—Ag—Cu solder which constitutes the solder base has a composition of 0.5-1.1 mass % of Ag, 0.7-0.8 mass % of Cu, and a remainder of Sn. In contrast to the art disclosed in Patent Documents 1-4 which suppress the formation of $Cu_6Sn_5$ intermetallic compound in the interface of Cu electrodes by decreasing the content of Cu in an Sn—Ag—Cu ternary alloy composition, in a solder ball according to the present invention, Ni is added to a Sn—Ag—Cu ternary alloy composition having a Cu content in the vicinity of the eutectic point of 0.75 mass %, thereby suppressing the formation of $Cu_6Sn_5$ intermetallic compound in the interface of Cu electrodes even if the Cu content of the solder is not decreased.

By limiting the Cu content in an Sn—Ag—Cu ternary alloy composition according to the present invention to the vicinity of the eutectic point of 0.75 mass %, the diffusion of Cu from Cu electrodes in an Sn—Ag—Cu ternary composition in which Cu is in a saturated state is suppressed.

Another characteristic of solder balls according to the present invention is that by making the Cu content of a solder alloy having an Sn—Ag—Cu ternary composition close to the eutectic point of 0.75 mass %, not only is diffusion of Cu from Cu electrodes suppressed, but the same effect is obtained with respect to Ni which forms a complete solid solution with Cu. Therefore, diffusion of Ni from Ni electrodes is suppressed. Furthermore, by previously adding Ni to solder, the effect of suppressing diffusion of Ni and Cu from electrodes of electronic parts and electrodes of substrates are both increased, and by forming a bonding interface by fine intermetallic compounds, resistance to drop impacts is also increased with respect to Ni electrodes.

The amount of Ni which is added to a solder composition for solder balls according to the present invention having a composition containing 0.5-1.1 mass % of Ag, 0.7-0.8 mass % of Cu, and a remainder of Sn is 0.05-0.08 mass %. In the present invention, by making the amount of Ni which is added to an Sn—Ag—Cu solder alloy 0.05-0.08 mass %, it is possible to obtain a solder ball for BGA electrodes in which Ni does not precipitate in a concentrated manner on the surface of Sn—Ag—Cu balls and which has excellent temperature cycle properties and resistance to drop impacts.

In the present invention, by adding Ni to a solder alloy having an Sn—Ag—Cu ternary composition in which the Cu content is in the vicinity of the eutectic point of 0.75 mass %, the formation of $Cu_6Sn_5$ intermetallic compound in the interfaces of Cu electrodes can be suppressed without any decrease in the content of Cu in the solder. Furthermore, as a result of the addition of a small amount of Ni as in the present invention to a solder alloy having an Sn—Ag—Cu ternary composition, the SnCu compound $Cu_6Sn_5$ in the solder is refined, and particles of intermetallic compounds formed in the interfaces between electronic parts and substrate electrodes become fine, resulting in the formation of bonding interfaces which do not readily undergo fracture.

If the added amount of Ni is less than 0.05 mass % which is too small, it becomes difficult to obtain the above-mentioned effects, and an increase in resistance to drop impacts is not realized. If the added amount exceeds 0.08 mass % which is excessive, the concentration of Ni in bonding interface compounds increases, resulting in the formation of bonding interfaces which are brittle and easily break, thereby decreasing the resistance to drop impacts. In addition, if too much Ni is added, it is not possible to avoid an increase in the hardness of the solder, which is unsuitable for achieving resistance to drop impacts. In this manner, when the added amount of Ni is not suitable, there is a tendency for resistance to drop impacts to decrease.

Effects of the Invention

By using a solder ball according to the present invention, it is possible to use a solder ball which has resistance to drop impacts with respect to both Cu electrodes and Ni electrodes and which has a low occurrence of failure when electronic parts having electrodes mounted thereon are dropped due to the effect of suppressing fusion defects. This provides the advantage that it is possible to smoothly cope with frequent changes in the design of electrodes.

By using a solder ball according to the present invention, it is possible to connect electrodes of a BGA or CSP to a printed circuit board with minimized occurrence of failure when electronic parts are dropped even with Cu electrodes having Cu lands coated with a water-soluble preflux (referred to as OSP=organic solderability preservative) or Ni electrodes including those having an Ni substrate coated with Au plating or Pd/Au plating.

DETAILED DESCRIPTION OF THE PREFERRED EMBODIMENTS

Figure 1:
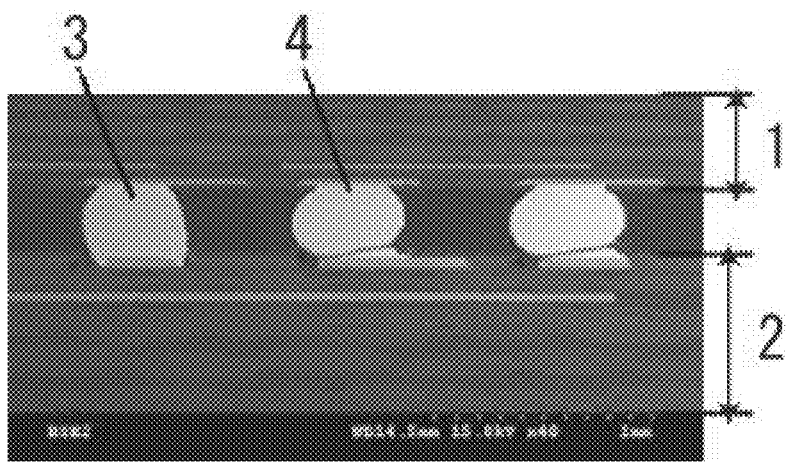
FIG. 1 shows an example of the phenomenon of fusion defects.
Figure 2:
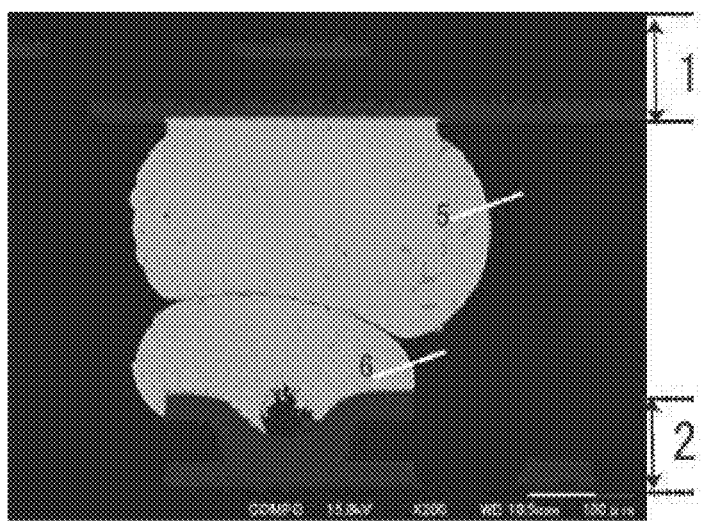
FIG. 2 shows an example in which a compound formed inside a solder ball impedes fusion with a solder paste.
Figure 3:
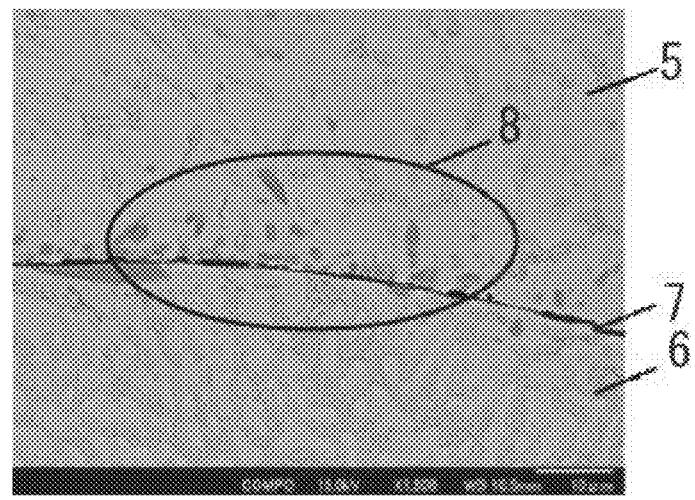
FIG. 3 shows an enlarged image of an example in which a compound formed inside a solder ball impedes fusion with solder paste.
Figure 4:
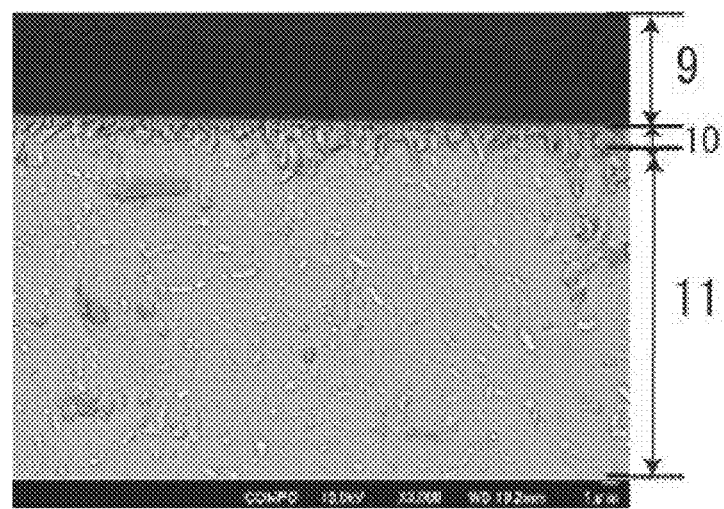
FIG. 4 shows a bonding interface compound layer in Example 2.
Figure 5:
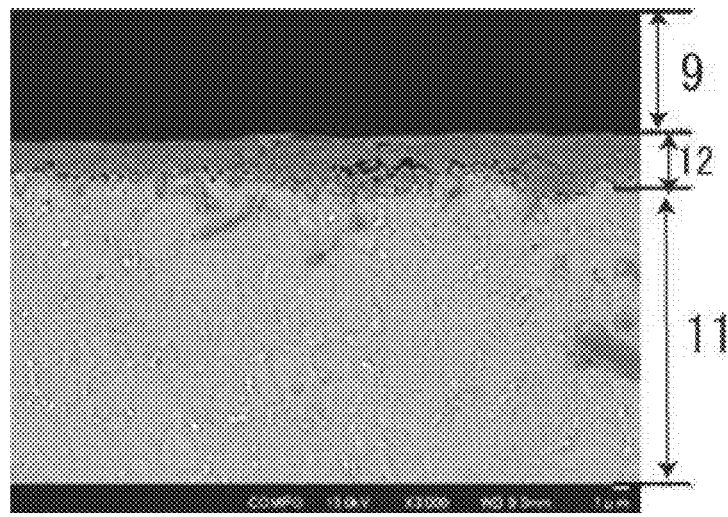
FIG. 5 shows a bonding interface compound layer in Comparative Example 9.
Figure 6:
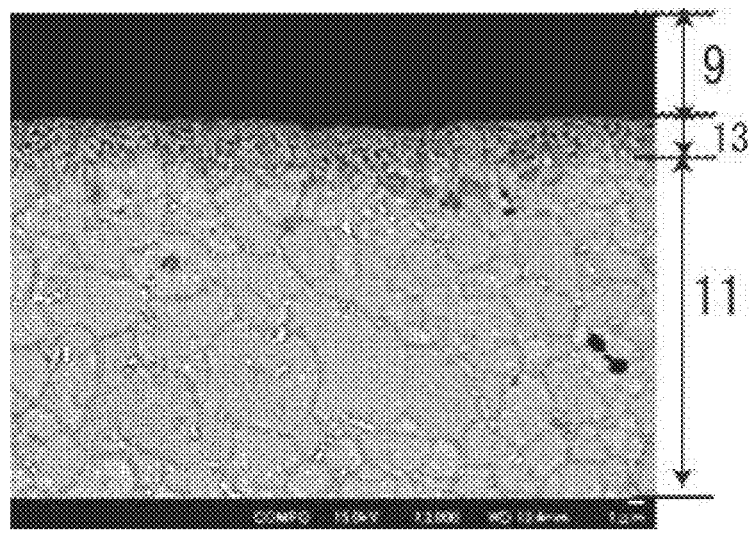
FIG. 6 shows a bonding interface compound layer in Comparative Example 10.
Figure 7:
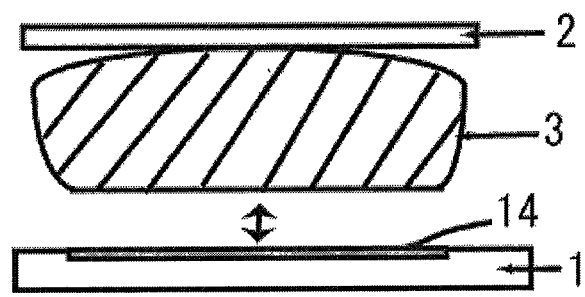
FIG. 7 shows a schematic view of interface peeling.
Figure 8:
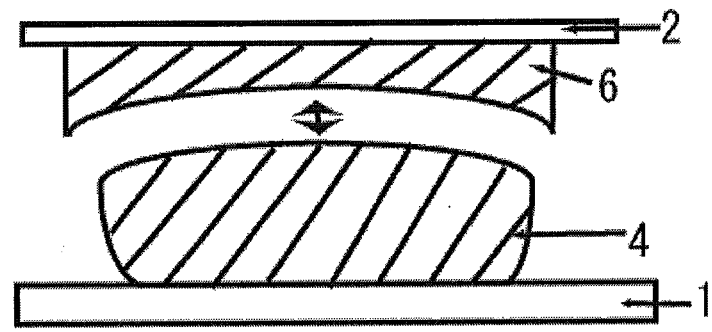
FIG. 8 shows a schematic view of a fusion defect.

A solder ball according to the present invention, which has resistance to drop impacts with respect to both Cu electrodes and Ni electrodes, is preferably used for bump formation on packaged parts such as BGAs and CSPs having electrodes on their bottom surfaces.

If the Ag content of an Sn—Ag—Cu—Ni based solder alloy for a solder ball according to the present invention is less than 0.5 mass %, the strength of the solder decreases, and fracture of the solder occurs easily when undergoing an impact stress due to dropping or the like. If the Ag content exceeds 1.1 mass %, the hardness of the solder becomes high and its impact absorbing properties decrease, thereby causing peeling to take place at the interfaces. Accordingly, the Ag content of an alloy for a solder ball according to the present invention must be 0.5-1.1 mass % and more preferably 0.9-1.1 mass %.

If the Cu content of an Sn—Ag—Cu—Ni based solder alloy for a solder ball according to the present invention is less than 0.7 mass %, the alloy composition moves away from the eutectic point of Sn—Ag—Cu. As a result, when using Cu electrodes, due to diffusion of Cu from the Cu electrodes into solder, a thick $Cu_6Sn_5$ intermetallic compound layer is formed in the interfaces of the Cu electrodes, thereby decreasing the resistance to drop impacts of the solder. If the Cu content of an Sn—Ag—Cu—Ni based solder alloy exceeds 0.8 mass %, the alloy composition moves away from the eutectic point of Sn—Ag—Cu, so $Cu_6Sn_5$ intermetallic compounds easily form in the reaction layer between the solder alloy and Cu electrodes. As a result, $Cu_6Sn_5$ intermetallic compound formed in the bonding interface between Cu electrodes and solder becomes thick. Accordingly, the Cu content of an Sn—Ag—Cu—Ni based solder alloy for a solder ball according to the present invention must be 0.7-0.8 mass %.

If the Ni content of an Sn—Ag—Cu—Ni based solder alloy for a solder ball according to the present invention is less than 0.05 mass %, the effect of the addition of Ni is not obtained, and it becomes easy for Ni to diffuse from Ni electrodes, thereby causing an intermetallic compound to easily form in interfaces. Therefore, the Ni content of an Sn—Ag—Cu—Ni based solder alloy must be at least 0.05 mass %. On the other hand, if the Ni content exceeds 0.08 mass %, the Ni concentration in an intermetallic compound formed in bonding interfaces increases and the bonding strength decreases while the hardness of the solder increases. As a result, it becomes easy for interface peeling to take place when an impact is applied. In addition, if the Ni content exceeds 0.08 mass %, the occurrence of fusion defects increases. Therefore, it is necessary for the Ni content in an Sn—Ag—Cu—Ni based solder alloy for a solder ball according to the present invention to be 0.05 0.08 mass %.

An Sn—Ag—Cu—Ni based solder alloy for a solder ball according to the present invention may further contain a total of 0.003-0.1 mass % of at least one element selected from Fe, Co, and Pt. The addition of Fe, Co, or Pt to an alloy for a solder ball refines an intermetallic compound layer which is formed in bonding interfaces and suppresses the thickness thereof, so it produces an effect of improving resistance to dropping. If the content of an element selected from Fe, Co, and Pt is less than 0.003 mass %, it becomes extremely difficult to obtain the above-described effect, while if such elements are added in excess of 0.1 mass %, the hardness of solder bumps increases and the problem develops that interface peeling occurs in response to impacts.

It is also possible to add a total of 0.003-0.1 mass % of at least one element selected from Bi, In, Sb, P, and Ge to an Sn—Ag—Cu—Ni based solder alloy for a solder ball according to the present invention.

After a solder ball is mounted on a module substrate, image recognition is used to determine if the solder ball has been soldered. If the solder ball has undergone discoloration such as yellowing, image recognition determines that a defect has occurred. Therefore, it is preferable that a solder ball not undergo discoloration during reflow.

The effect of the addition of Bi, In, Sb, P, or Ge is to prevent discoloration due to heat or the like, and the addition makes it possible to avoid errors during quality inspection of bumps. If the content of an element selected from Bi, In, Sb, P, and Ge is less than 0.003 mass %, it becomes extremely difficult to obtain the above-described effect, while if they are added in excess of 0.1 mass %, the hardness of solder bumps increases and there may be a decrease in the effect of reducing resistance to dropping.

Solder balls according to the present invention are used for electrodes. The diameter of the solder balls is at least 0.1 mm, preferably at least 0.3 mm, and more preferably at least 0.5 mm. In recent years, miniaturization of electronic equipment is progressing, and solder balls which are mounted on electronic parts continue to become finer. In the case of flip chip bonding, solder balls of 0.1 mm or smaller are commonly used, while solder balls like those of the present invention which are solder balls for electrodes of a CSP or BGA which may incorporate a flip chip inside it have a size which is typically 0.1 mm or larger.

EXAMPLES

Solder alloys having the composition shown in the following table were prepared, and solder balls having a diameter of 0.3 mm were prepared by the droplet spraying method. These solder balls were used to fabricate CSP substrates by the following procedure.

1. The solder balls which were prepared using each composition were soldered by reflow soldering using a WF-6400 flux manufactured by Senju Metal Industry Co., Ltd. to a CSP module substrate measuring 12×12 mm and having electroplated Ni/Au electrodes, electroplated Ni/Pd/Au electrodes, or Cu lands treated with an OSP (Cu—OSP) to fabricate a CSP in which each solder composition was used for electrodes.

2. A glass epoxy substrate (FR-4) measuring 30×120 mm and having a thickness of 0.8 mm was printed with solder paste in the electrode pattern formed on that substrate, and after the CSP fabricated in step 1 was mounted thereon, reflow soldering was carried out for 40 seconds at a temperature of at least 220° C. with a peak temperature of 245° C.

3. A drop impact test was carried out under the following conditions. The test method was as follows using the glass epoxy substrate prepared in step 2 on which a CSP was mounted and in which both ends of the substrate were secured to a base so as to be raised 10 mm above the base using a dedicated jig. An impact with an acceleration of 1500 G was repeatedly applied in accordance with JEDEC specifications, and the number of drops until the occurrence of failure was recorded, with failure being considered the point at which the resistance increased to 1.5 times the initial resistance.

It was found that resistance to drop impacts was not obtained with solder balls using an Sn—Ag—Cu—Ni based solder alloy containing a large amount of Ni as in Patent Document 2 even when soldering was performed to Ni electrodes.

In order to measure the rate of occurrence of fusion defects, the same solder balls as above were mounted on a substrate in the following manner.

1. Solder balls which were prepared using each composition were subjected to treatment for 24 hours at a temperature of 110° C. and a relative humidity of 85%.

2. A glass epoxy substrate (FR-4) measuring 36×50 mm and having a thickness of 1.2 mm was printed with solder paste in the electrode pattern formed thereon, and after the solder balls treated in step 1 were mounted on the substrate, reflow heating was carried out for 40 seconds at 220° C. or above with a peak temperature of 245° C.

3. The number of occurrences of fusion defects between the solder balls and the solder paste was recorded using a stereomicroscope, and the rate of occurrence of fusion defects was calculated.

Subsequently, a spreading test was carried out using the prepared solder balls in the following manner. The substrate

TABLE 1

| | | Solder composition (mass %) | | | Occurrence of fusion defects | Spreading | Resistance to drop impacts (number of drops) | | | Comments |
|---|---|---|---|---|---|---|---|---|---|---|
| | | Sn | Ag | Cu | Ni | (%) | (mm$^2$) | Ni/Au | Ni/Pd/Au | Cu-OSP | |
| Example | 1 | Rem | 0.5 | 0.7 | 0.05 | 1.2 | 0.76 | 80 | 72 | 95 | |
| | 2 | Rem | 1 | 0.7 | 0.05 | 4.9 | 0.82 | 83 | 46 | 50 | |
| | 3 | Rem | 1 | 0.7 | 0.07 | 2.5 | 0.80 | 62 | 79 | 58 | |
| | 4 | Rem | 1 | 0.7 | 0.08 | 2.9 | 0.86 | 83 | 77 | 123 | |
| | 5 | Rem | 1 | 0.75 | 0.07 | 1.8 | 0.85 | 98 | 81 | 94 | |
| | 6 | Rem | 1 | 0.8 | 0.05 | 4.3 | 0.81 | 34 | 59 | 46 | |
| | 7 | Rem | 1 | 0.8 | 0.07 | 4.0 | 0.81 | 37 | 58 | 67 | |
| | 8 | Rem | 1 | 0.8 | 0.08 | 2.2 | 0.79 | 65 | 74 | 89 | |
| | 9 | Rem | 1.1 | 0.8 | 0.07 | 3.7 | 0.91 | 43 | 53 | 49 | |
| | 10 | Rem | 1.1 | 0.8 | 0.08 | 2.8 | 0.88 | 48 | 66 | 68 | |
| Comparative Example | 1 | Rem | 0 | 0.7 | | 1.6 | 0.55 | 5 | 9 | 2 | |
| | 2 | Rem | 0.3 | 0.7 | 0.05 | 0.5 | 0.58 | 78 | 65 | 47 | Pat. Doc. 3 |
| | 3 | Rem | 1 | 0.5 | | 1.8 | 0.87 | 1 | 58 | 54 | |
| | 4 | Rem | 1 | 0.5 | 0.02 | 3.2 | 0.85 | 4 | — | 33 | |
| | 5 | Rem | 1 | 0.5 | 0.05 | 0.5 | 0.88 | 1 | — | 50 | |
| | 6 | Rem | 1 | 0.7 | 0.02 | 0.9 | 0.90 | 10 | — | 36 | |
| | 7 | Rem | 1 | 0.7 | 0.1 | 10.6 | 0.74 | 12 | — | 1 | |
| | 8 | Rem | 1 | 0.8 | 0.02 | 4.6 | 0.87 | 5 | 22 | 15 | |
| | 9 | Rem | 1 | 0.8 | 0.1 | 12.5 | 0.74 | 8 | 16 | 1 | |
| | 10 | Rem | 1 | 1 | | 8.6 | 0.86 | 1 | 1 | 1 | |
| | 11 | Rem | 1 | 1 | 0.05 | 15.7 | 0.81 | 1 | 1 | 1 | Pat. Doc. 4 |
| | 12 | Rem | 1.2 | 0.5 | 0.02 | 4.4 | 0.82 | 3 | 12 | 28 | |
| | 13 | Rem | 1.5 | 0.5 | 0.5 | 18.4 | 0.85 | 6 | 9 | 1 | Pat. Doc. 2 |
| | 14 | Rem | 1.2 | 0.7 | 0.02 | 3.8 | 0.80 | 7 | 19 | 17 | |
| | 15 | Rem | 3 | 0.5 | | 1.6 | 0.94 | 1 | 1 | 7 | | which was used was made of the same material as the substrate used to investigate the rate of occurrence of fusion defects.

1. A glass epoxy substrate (FR-4) having a thickness of 1.2 mm on which linear electrodes measuring 0.24×16 mm were formed was printed with WF-6400 flux manufactured by Senju Metal Industry Co., Ltd. to form a diameter of 0.24 mm having a thickness of 0.1 mm on each electrode, and after a solder ball was placed on the flux, reflow heating was carried out for 40 seconds at a temperature of at least 220° C. and a peak temperature of 245° C.

2. The area of spreading of the solder was measured using a stereomicroscope.

Comparative Examples 7, 9, 10, 11, and 13 had a solder ball alloy composition in which the Cu content exceeded 0.8 mass % or the Ni content exceeded 0.07 mass %, so the rate of occurrence of fusion defects exceeded 8%, and an effect of suppressing fusion defects was not obtained.

In particular, the rate of occurrence of fusion defects for Comparative Example 13, which had an Sn-1.5Ag-0.5Cu-0.5Ni solder composition described in Patent Document 2, was markedly increased. This was because the Ni content in the solder was too high, so there was too much formation of a compound and the fusing properties of the solder with the paste were impaired. As a result, the rate of occurrence of fusion defects increased.

Similarly, in Comparative Examples 10 and 11, the Cu content was too high, and there was too much formation of a compound, thereby inducing the occurrence of fusion defects.

In Comparative Examples 1-2, the Ag content was low, so a significant decrease in spreading was observed. Compared to Example 1, the area of spreading in Comparative Examples 1-2 decreased by at least 20%. When spreading is inadequate, a good bond is not obtained and a sufficient bonding strength may not be maintained.

In Comparative Examples 3-6, 8, 12, 14, and 15, the rate of occurrence of fusion defects was less than 5%, and sufficient spreading was maintained. However, because the content of Ag, Cu, or Ni was not optimized, an effect of improving resistance to drop impacts was not obtained.

The effect of Ni when Ag is fixed at 1 mass % and Cu is fixed at 0.7 mass % will be considered. When the Ni content is selected to be 0.1 mass %, which exceeds 0.08 mass %, the rate of occurrence of fusion defects markedly increases. Conversely, when the Ni content is selected to be 0.02 mass %, which falls below 0.05 mass %, although an effect of suppressing fusion defects is obtained, resistance to drop impacts is not obtained. Thus, a solder alloy which both suppresses fusion defects and improves resistance to drop impacts is obtained by selecting the Ni content to be 0.05-0.08 mass %.

Next, the range for the Cu content which suppresses fusion defects and improves resistance to drop impacts when maintaining the Ni content at 0.05 mass % and the Ag content at 1 mass % will be considered. When the Cu content is selected to be 1 mass %, which exceeds 0.8 mass %, the rate of occurrence of fusion defects markedly increases. When the Cu content is selected to be 0.5 mass %, which falls below 0.7 mass %, an improvement in resistance to drop impacts is not obtained. Thus, a Cu content of 0.7-0.8 mass % is optimal for a solder alloy having both properties.

The above results show that a solder composition comprising 0.5-1.1 mass % of Ag, 0.7-0.8 mass % of Cu, 0.05-0.08 mass % of Ni, and a remainder of Sn can be used both for Ni electrodes plated with Au or the like and Cu electrodes coated with a water-soluble preflux. The solder composition has both of an effect of suppressing interface peeling and an effect of suppressing fusion defects. Therefore, a solder alloy is obtained which has a low rate of malfunctions when electronic parts having electrodes mounted thereon are dropped.

INDUSTRIAL APPLICABILITY

According to the present invention, a solder ball for electrodes is provided which has resistance to drop impacts both when it is used with Cu electrodes and when it is used with Ni electrodes. If the amount of Ni added to a solder alloy having an Sn—Ag—Cu ternary composition exceeds 0.1 mass %, a Ni-containing compound easily precipitates on the surface of the solder ball, and fusion defects with respect to mounting paste easily occur. A solder ball according to the present invention has an Ni content limited to 0.05-0.08 mass %, which makes it difficult that the phenomenon of a compound precipitating on the surface of the solder ball takes place, and which is also effective at suppressing the phenomenon of fusion defects.

EXPLANATION OF REFERENTIAL NUMERALS

1 BGA part
2 mounting substrate
3 fused solder bump
4 unfused solder bump
5 solder ball after heating for mounting
6 solder paste after heating for mounting
7 unfused portion
8 compound by which fusion is impeded
9 BGA electrodes
10 bonding interface compound having resistance to drop impacts
11 solder bump
12 bonding interface compound which does not have resistance to drop impacts due to insufficient Cu content
13 bonding interface compound which does not have resistance to drop impacts due to insufficient Ni content
14 land

The invention claimed is:

1. A process for mounting a BGA or CSP on a printed circuit board, the process comprising:
melting and fusing together solder paste and a solder ball which has a solder composition comprising 0.5-1.1 mass % of Ag, 0.7-0.8 mass % of Cu, 0.05-0.08 mass % of Ni, and a remainder of Sn,
wherein the solder ball is placed on an electrode of the BGA or CSP substrate and the solder paste is applied onto an opposing electrode of the printed circuit board.

2. The process according to claim 1, wherein the solder composition comprises 0.9-1.1 mass % of Ag, 0.7-0.8 mass % of Cu, 0.05-0.08 mass % of Ni, and a remainder of Sn.

3. The process according to claim 1, wherein the solder composition comprises 1.0 mass % of Ag, 0.75 mass % of Cu, 0.07 mass % of Ni, and a remainder of Sn.

4. The process according to claim 1, wherein the solder composition further comprises at least one element selected from Fe, Co, and Pt in a total amount of 0.003-0.1 mass %.

5. The process according to claim 1, wherein the solder composition further comprises at least one element selected from Bi, In, Sb, P, and Ge in a total amount of 0.003-0.1 mass %.

6. The process according to claim 1, wherein the solder ball has a diameter of at least 0.1 mm.

7. The process according to claim 1, wherein the solder ball has a diameter of at least 0.3 mm.

8. The process according to claim 1, wherein the solder ball has a diameter of at least 0.5 mm.

9. The process according to claim 1, wherein the solder composition consists of 0.5-1.1 mass % of Ag, 0.7-0.8 mass % of Cu, 0.05-0.08 mass % of Ni, optionally at least one element selected from Fe, Co, Pt, Bi, In, Sb, P, and Ge, and a remainder of Sn.

10. The process according to claim 1, wherein the solder composition consists of 0.9-1.1 mass % of Ag, 0.7-0.8 mass % of Cu, 0.05-0.08 mass % of Ni, optionally at least one element selected from Fe, Co, Pt, Bi, In, Sb, P, and Ge, and a remainder of Sn.

11. The process according to claim 1, wherein the solder composition consists of 1.0 mass % of Ag, 0.75 mass % of Cu, 0.07 mass % of Ni, optionally at least one element selected from Fe, Co, Pt, Bi, In, Sb, P, and Ge, and a remainder of Sn.

12. A method of forming a solder bump on a module substrate having electrodes selected from electroplated Ni/Au electrodes, electroless Ni/Pd/Au electrodes, and Cu—OSP electrodes using a lead-free solder ball wherein the lead-free solder ball is used for electrodes by mounting on a module substrate for a BGA or CSP and which has a solder composition comprising 0.5-1.1 mass % of Ag, 0.7-0.8 mass % of Cu, 0.05-0.08 mass % of Ni, and a remainder of Sn.

13. The method according to claim 12, wherein the solder composition consists of 0.5-1.1 mass % of Ag, 0.7-0.8 mass % of Cu, 0.05-0.08 mass % of Ni, optionally at least one element selected from Fe, Co, Pt, Bi, In, Sb, P, and Ge, and a remainder of Sn.

14. The method according to claim 12, wherein the solder composition consists of 0.9-1.1 mass % of Ag, 0.7-0.8 mass % of Cu, 0.05-0.08 mass % of Ni, optionally at least one element selected from Fe, Co, Pt, Bi, In, Sb, P, and Ge, and a remainder of Sn.

* * * * *

UNITED STATES PATENT AND TRADEMARK OFFICE
CERTIFICATE OF CORRECTION

PATENT NO. : 9,700,963 B2  
APPLICATION NO. : 15/196227  
DATED : July 11, 2017  
INVENTOR(S) : Tsukasa Ohnishi et al.

It is certified that error appears in the above-identified patent and that said Letters Patent is hereby corrected as shown below:

In the Specification

Column 1, Line 7, delete "September 18, 2013," and insert -- November 20, 2013, --

Signed and Sealed this  
Tenth Day of October, 2017

Joseph Matal  
*Performing the Functions and Duties of the*  
*Under Secretary of Commerce for Intellectual Property and*  
*Director of the United States Patent and Trademark Office*